United States Patent
Speer

(10) Patent No.: US 12,010,922 B2
(45) Date of Patent: Jun. 11, 2024

(54) METHOD FOR PRODUCING A PIEZOELECTRIC STACK ACTUATOR, AND PIEZOELECTRIC STACK ACTUATOR

(71) Applicant: PI Ceramic GmbH, Lederhose (DE)

(72) Inventor: Kevin Speer, Mörsdorf (DE)

(73) Assignee: PI CERAMIC GMBH, Lederhose (DE)

( * ) Notice: Subject to any disclaimer, the term of this patent is extended or adjusted under 35 U.S.C. 154(b) by 123 days.

(21) Appl. No.: 17/428,106

(22) PCT Filed: Feb. 10, 2020

(86) PCT No.: PCT/EP2020/053299
§ 371 (c)(1),
(2) Date: Aug. 3, 2021

(87) PCT Pub. No.: WO2020/161353
PCT Pub. Date: Aug. 13, 2020

(65) Prior Publication Data
US 2022/0059751 A1    Feb. 24, 2022

(30) Foreign Application Priority Data
Feb. 8, 2019  (DE) .......................... 102019201650.2

(51) Int. Cl.
*H10N 30/87*     (2023.01)
*H10N 30/057*    (2023.01)
(Continued)

(52) U.S. Cl.
CPC ......... *H10N 30/871* (2023.02); *H10N 30/057* (2023.02); *H10N 30/063* (2023.02); *H10N 30/503* (2023.02)

(58) Field of Classification Search
CPC .. H10N 30/871; H10N 30/06; H10N 30/0057; H10N 30/503
See application file for complete search history.

(56) References Cited

U.S. PATENT DOCUMENTS 4,011,474 A * 3/1977 O'Neill ................ H10N 30/883
                                              310/369
4,384,230 A   5/1983 Wisner
(Continued)

FOREIGN PATENT DOCUMENTS

DE    102004012282 A1    10/2004
DE    102004012284 A1    12/2004
(Continued)

OTHER PUBLICATIONS

International Search Report (PCT/ISA/210) with translation and Written Opinion (PCT/ISA/237) mailed on Apr. 24, 2020, by the European Patent Office as the International Searching Authority for International Application No. PCT/EP2020/053299.
(Continued)

*Primary Examiner* — Jeffrey T Carley
(74) *Attorney, Agent, or Firm* — BUCHANAN INGERSOLL & ROONEY PC

(57) ABSTRACT

A method for producing a piezoelectric stack actuator and a piezoelectric stack actuator are disclosed. To increase service life of a piezoelectric stack actuator made up of individual actuators, includes providing at least two actuators the method and designed and configured to generate a deflection along an axis (A) when electrically activated; and coupling the at least two actuators to form the stack actuator such that deflections of the actuators generated when the actuators are electrically activated are overlaid along a stacking axis (S) and there is a force-coupling of the actuators over at least one coupling area (K) that is smaller than a projection area (P) of the actuator onto a plane (E) perpendicular to the stacking axis.

13 Claims, 5 Drawing Sheets

(51) Int. Cl.
  *H10N 30/063* (2023.01)
  *H10N 30/50* (2023.01)

(56) References Cited

U.S. PATENT DOCUMENTS

| | | | | |
|---|---|---|---|---|
| 4,721,447 | A | 1/1988 | Erckmann | |
| 4,752,712 | A * | 6/1988 | Tomita | H10N 30/503 29/25.35 |
| 7,309,945 | B2 * | 12/2007 | Iwase | H10N 30/508 310/365 |
| 7,420,319 | B2 | 9/2008 | Kastl et al. | |
| 2006/0066178 | A1 * | 3/2006 | Lindner | H10N 30/508 310/328 |
| 2006/0181178 | A1 | 8/2006 | Kastl et al. | |
| 2006/0214541 | A1 | 9/2006 | Tsuzuki et al. | |
| 2009/0152991 | A1 | 6/2009 | Goat et al. | |
| 2010/0139621 | A1 * | 6/2010 | Murai | H10N 30/508 29/25.35 |
| 2010/0140379 | A1 * | 6/2010 | Suzuki | H10N 30/053 239/569 |
| 2013/0342080 | A1 * | 12/2013 | Suma | H10N 30/501 310/348 |

FOREIGN PATENT DOCUMENTS

| | | | | |
|---|---|---|---|---|
| DE | 10335023 | A1 | 2/2005 | |
| DE | 102008041061 | A1 | 2/2009 | |
| DE | 102007046314 | A1 | 4/2009 | |
| DE | 102007046315 | A1 | 4/2009 | |
| EP | 1107325 | A2 * | 6/2001 | ......... H01L 41/0533 |
| EP | 1793430 | A1 | 6/2007 | |
| EP | 1835553 | A1 * | 9/2007 | ............. B29C 39/18 |
| EP | 2079117 | A2 * | 7/2009 | ........... H01L 41/083 |
| JP | H0242456 | U | 3/1990 | |
| JP | 2006179525 | A | 7/2006 | |
| JP | 2006216850 | A | 8/2006 | |
| JP | 2006229068 | A | 8/2006 | |
| WO | 2003105246 | A2 | 12/2003 | |
| WO | 2006000479 | A1 | 1/2006 | |
| WO | 2006100247 | A1 | 9/2006 | |
| WO | WO-2007009908 | A1 * | 1/2007 | ........... H01L 41/083 |
| WO | 2008105381 | A1 | 9/2008 | |
| WO | 2012/137542 | A1 | 10/2012 | |
| WO | 2015174651 | A1 | 11/2015 | |
| WO | WO-2016032029 | A1 * | 3/2016 | ......... H01L 41/0477 |

OTHER PUBLICATIONS

Search Report mailed on Aug. 21, 2019, by the German Patent Office for Application No. 102019201650.2.
Office Action (Notice of Grounds of Rejection) issued Dec. 13, 2022, by the Japan Patent Office in corresponding Japanese Patent Application No. 2021-569593 and an English translation of the Office Action. (12 pages).

* cited by examiner

METHOD FOR PRODUCING A PIEZOELECTRIC STACK ACTUATOR, AND PIEZOELECTRIC STACK ACTUATOR

BACKGROUND

The invention relates to a piezoelectric stack actuator and a method for producing the same.

Piezoelectric stack actuators of alternatingly arranged piezoelectric layers and electrodes are known e.g. from U.S. Pat. Nos. 4,384,230, 4,721,447.

US 2010/0140379 A1, US 2006/0066178 A1, JP 2006-179525 A, JP 2006-216850 A, JP 2006-229068 A, US 2010/0139621 A1, and U.S. Pat. No. 7,309,945 disclose, among other things, monolithic blocks of piezoelectric layers and electrodes sintered in one piece.

From WO 2003/105246 A2, the principle of selectively introduced, controlled break-off areas is known to prevent an accumulation of tension in monolithic actuators.

According to an alternative design, which presents the starting point for the invention, the piezoelectric stack actuators are assembled from actuators which, taken alone, already comprise one or several piezoceramic layers and are preferably designed as functional multi-layer actuators, so that the deflections of the individual actuators are overlaid in the stack direction and sum up. In contrast to monolithic blocks of alternatingly arranged piezoelectric layers and electric contacts, these so-called chip stacks are glued since the polarisation of the actuators will get lost at temperatures above 300° C., and sintering is consequently ruled out. Due to gluing, the actuator segments are spaced apart in the stack bond due to the adhesive between individual actuators along the stacking axis. Moreover, bulky actuators cannot be reliably produced monolithically free from defects due to problems with the organic burnout. Adhesion moreover promotes the construction of stacks of flexible lengths with a minimum production time.

WO 2006/100247 A1 discloses a stack-like arrangement of multi-layer actuators, wherein the actuators are connected by an all-over adhesion across a heat-conducting metal layer.

In stack actuators where the adjacent piezoelectric layers are connected all-over, mechanical tensions occur during electric activation since the piezoelectric layers coupled to each other mutually block themselves in their deformation. This problem increases as the stack height increases.

In the production of such stack actuators, which are also referred to as glued chip stacks of single- or multi-layer actuators, an uncontrolled crack formation can occur. This occurs although the individual segments had been previously polarised 100% and checked for functionality and cracks. After these crack-free actuators (chips) have been glued and reactivated, cracks will then occur in the outer passive insulating layer of the actuators (chips).

These cracks affect the resistibility or service life of the actuators, in particular in a damp environment. In the course of quality control, the affected parts are therefore usually rejected and thereby cause outage losses. Furthermore, production planning is disturbed thereby since the cracks leading to an outage only occur at the end of a process that lasted altogether several weeks.

Even in actuators that are free from cracks at the time of the outgoing materials inspection, cracks regularly occur in the passive boundary layer under application conditions, in particular in a dynamic operation. These affect the reliability or service life in the same way and can thus lead to a standstill of sophisticated production plants in an extreme case. A mixed operation of static and dynamic loads has a particularly critical effect on the service life of actuators. By the alternating load, cracks in the passive layer are promoted which then permit electromigration as damaging mechanism due to penetrating moisture during the static operation, without any self-heating of the actuator.

A further critical operation mode is the activation at low frequencies (some Hz), where no self-heating of the actuator via ambient temperature takes place and thus moisture can be present in the direct proximity of the actuator, and the alternating load moreover promotes the formation of cracks.

Experience shows that the frequency of such cracks increases as the actuator cross-section increases.

Even in high-voltage actuators, where single-layer actuators and contact plates are alternatingly arranged in stacks and glued to each other, short circuits occur due to cracks in the edge region of the actuator segments or at the transition between the active and the passive regions. In contrast to multi-layer actuators, the single-layer actuators require higher voltages to electrically activate the piezoceramic material to generate a deformation.

SUMMARY

The object underlying the present invention is to prevent the above-described crack formation to thus increase the service life of a piezoelectric stack actuator made up of individual actuators, in particular during use in a damp environment.

This object is achieved by the method for producing a piezoelectric stack actuator according to claim 1, comprising the following steps:

Step A: Providing at least two actuators, which are designed to generate a deflection along an axis when electrically activated.

Step B: Coupling the at least two actuators to form the stack actuator such that the deflections of the actuators generated when the actuators are electrically activated are overlaid along a stacking axis and there is a force-coupling of the actuators over at least one coupling area that is smaller than a projection area of the actuator onto a plane perpendicular to the stacking axis.

According to the invention, the piezoelectric stack actuator is produced by coupling individual actuators. From these already functional actuators, a piezoelectric stack actuator can be made up with not much efforts, the stack actuator achieving a clearly larger deflection along the stacking axis than each individual actuator. Furthermore, the stack actuators can be produced essentially more easily from the functional individual actuators than a stack actuator which is designed as a monolithic block and has a considerable axial extension.

In each actor, tensile stresses occur in the so-called passive region without electrodes during expansion since this region does not also expand in contrast to the so-called active region. Due to the low height of the actuators and a deformation of the passive regions, the tensile stress is below a critical load in each individual actuator. In an all-over coupling of the adjacent actuators, however, deformations of the passive regions are no longer possible since these occur in various directions with respect to the coupling plane and accordingly block each other. The effect will continuously increase the more actuators are glued one upon the other. The tensions occurring by the deformation thus sum up and exceed the strength of the passive regions. At weak points, a crack formation thereby occurs.

The solution of the object mentioned at the beginning analogously is to selectively decouple the adjacent actuators, preferably in the edge region. According to the invention, the individual actuators are coupled to each other over a coupling area that is smaller than a projection area of the actuator onto a plane perpendicular to the stacking axis. The coupling area preferably corresponds, in its flat expansion, to that of the active region of the actuator, i.e. the flat expansion of the stack actuator in a plane perpendicular to the stacking axis, minus the area of the passive region. The passive region is usually located at the edge of the actuator. The actuators themselves employed here consist of single- or multi-layer packs with alternatingly arranged piezoceramic layers and electrodes/contacts extending in parallel with respect to each other in planes perpendicular to the stacking axis to generate a deflection along the stacking axis as a result. The region of the piezoceramic layers covered by the electrodes/contacts and electrically activated defines the so-called active region of the actuator which actively deforms when electrically activated. Non-activated regions of the piezoceramic layers (without electrodes) which do not actively but optionally passively deform when the actuators are electrically activated are referred to as insulation, insulating layer or passive region.

By the selective coupling or decoupling of the actuators over the coupling area, the peak loads in the passive regions of the actuators coupled to each other are reduced so that the crack formation mentioned in the beginning can be effectively prevented and the service life of the stack actuators produced according to the method according to the invention is clearly increased.

Advantageous developments are the subject matter of the subclaims.

It can be advantageous if Step A comprises at least one of the following Sub-steps:

Sub-step A1: Providing piezoceramic layers and electric contacts to make up the actuators, preferably as single-layer actuator or as multi-layer actuator. Such components for stack actuators are usually available at low costs and can be used to produce stack actuators of different sizes. The electric contacts for electrically activating the piezoceramic layers are also referred to as electrode layers or inner electrodes. The flat extension of the electric contacts or inner electrodes is preferably smaller than the flat extension of the piezoceramic layers. In the stack bond, the edge regions of the piezoceramic layers are then not covered by electric contacts or inner electrodes and are not electrically activated. Thereby, these edge regions of the piezoceramic layers do not deform actively, but optionally passively, and form the passive region of the actuator which is also referred to as "insulation" or "insulating layer". This ceramic "insulation" or "insulating layer" ensures an effective and permanent protection in particular of the inner electrodes, even in a damp environment. By the coupling of the actuators over the coupling area according to the invention, this effective, however brittle and hard protective layer of ceramic can be protected from defects.

Sub-step A2: Stacking the piezoceramic layers along an axis, preferably such that two adjacent piezoceramic layers face each other, with the insertion of one electric contact each, preferably an electrode layer or a contact plate with poles of the same polarities. This design proves to be particularly compact and advantageous in view of the connection of the piezoceramic layers for the electric activation.

Sub-step A3: Connecting the electric contacts with electrodes of corresponding polarities, wherein the electrodes of different polarities are preferably arranged spaced apart at the periphery of the actuator, preferably located on diametrically opposed sides of the actuator. The electrodes mentioned here are also referred to, among other terms, as side electrodes or outer electrodes.

Sub-step A4: Enveloping the piezoceramic layers and the electric contacts with a preferably ceramic insulating material, the envelope with the insulating material preferably being air-tight and/or moisture-tight. This design in particular promotes the application of the actuators in a damp environment.

Sub-step A5: Forming at least one coupling area for force-coupling the actuator with an adjacent actuator, preferably according to at least one of the following sub-steps:

Sub-step A5-1: Forming at least one coupling area in the active region of the actuator. The active region of the actuator is interspersed with electrodes or covered by electrodes and is actively deformed by the electric activation of the electrodes. The edge of the actuator around the active region then forms the so-called passive region which is not actively deformed by the electric activation of the piezoceramic layers but passively follows the deformation of the active region. In the passive region, load reduction sections resulting from the reduction of the coupling area compared to an extension of the actuator in a plane perpendicular to the axis are particularly effective because they permit a passive deformation of the insulation of the actuators coupled to each other and thus reduce peak loads in the region of the insulation. According to this feature, the active region includes the coupling area, i. e. the coupling area is located in the active region. In other words, with a projection onto a plane perpendicular to the stacking axis, the coupling area is located completely within the projection area of the electric contacts or inner electrodes.

Sub-step A5-2: Forming at least one coupling area at an additional element to be arranged between two actuators to be coupled, the additional element preferably being designed as an electrode. In this design, e.g. cylindrical or cuboid actuators without a front reduction of the extension of the actuator in a plane perpendicular to the axis can be coupled to each other via additional elements, the additional elements permitting a passive deformation of the insulation of the actuators coupled to each other and thus reducing peak loads in the region of the insulation. In the design as an electrode, the piezoceramic layers can be electrically activated via the additional element. This design is in particular suited for building so-called high-voltage stacks.

Sub-step A5-3: Forming the coupling area at one or both axial end(s) of the actuator or the additional element, preferably such that the coupling area forms one of the or both axial ends of the actuator or the additional element, respectively. In this design, the coupling of the actuators is particularly easy.

Sub-step A5-4: Forming the coupling area while forming a chamfer or a step to an adjacent and/or surrounding region, preferably an edge region of the actuator or the additional element, respectively. With these embodiments, the coupling area can be particularly easily created, for example, by slight material removal or material application at the front side of the actuators.

Sub-step A5-5: Forming the coupling area such that, with a projection onto a plane perpendicular to the stacking axis, the coupling area is located completely within the projection area of the actuator and is preferably enclosed by the projection area across its complete periphery. In this design, the passive edge regions of adjacent actuators are decoupled from each other, such that their passive deformation is permitted when the actuators are electrically activated, and peak loads are reduced in the region of the passive edge regions.

Sub-step A5-6: Forming the coupling area in a plane extending perpendicularly to the axis. In this design, a particularly simple coupling of the actuators is possible.

Sub-step A5-7: Forming the coupling area (K), such that with respect to the projection area (P) of the actuator, the following area ratio applies: $0.7*P \leq K < P$, preferably $0.8*P \leq K \leq 0.99*P$, preferably $0.9*P \leq K \leq 0.95*P$. The coupling area ideally has the same flat extension as the electrodes or the active region of the actuator, or is somewhat smaller, such that the passive region of the actuator which—in a projection onto a plane perpendicular to the axis is located radially outside the electrode—is located outside the coupling area. In other words, the decoupled region in the coupling plane outside the coupling area is essentially or exactly as wide as the passive region of the actuator, or somewhat larger. Thereby, via the coupling area, on the one hand, an ideal force coupling between the actuators in the active region of the actuator can be effected, while the passive edge region of the actuator is ideally decoupled to permit a passive deformation of the piezoceramic layers.

Sub-step A5-8: Forming the coupling area as an area penetrated by the axis and/or arranged concentrically with respect to the axis, wherein the coupling area is preferably embodied circularly for annularly. In this design, peak loads can be particularly effectively reduced since loads acting on the insulation are particularly uniformly distributed across the complete periphery of the coupling area.

Sub-step A5-9: Forming the coupling area from an adhesive. In this design, the adherend between two actuators is smaller than the flat extension of the actuators perpendicular to the stacking axis.

Sub-step A6: Providing at least two identical actuators. In this design, the assembly of the stack actuator is particularly easy.

However, it can also be of assistance if Step B comprises at least one of the following sub-steps:

Sub-step Arranging the at least two actuators with a regular and/or identical orientation with respect to the stacking axis, preferably such that the electrodes of the actuators with the same polarities are oriented in a line in parallel to the stacking axis, and/or that the facing sides of adjacent actuators are parallel. In this design, the assembly of the stack actuator is also particularly easy since in particular the electrodes of the individual actuators can be easily connected to each other.

Sub-step B2: Arranging an additional element between two adjacent actuators. In this embodiment, in particular cylindrical or cuboid individual actuators can be particularly easily coupled to each other without separate formation of a coupling area which is reduced compared to the flat extension of the actuator in a plane perpendicular to the axis.

Sub-step B3: Connecting the at least two actuators such that two adjacent actuators each are directly actively connected or indirectly actively connected via an additional element, preferably while forming a firmly bonded connection between the adjacent actuators or between each one of the adjacent actuators and the additional element arranged therebetween, preferably by an adhesive, wherein particularly preferably the adhesive glues the at least one coupling area completely. In this design, the piezoceramic layers are not connected into a monolithic block, for example by sintering, in contrast to the prior art mentioned in the beginning, the stack actuator is rather assembled by stacking and coupling functional individual actuators which are preferably glued to each other. Accordingly, the piezoceramic layers of the stack actuator are arranged in packs and spaced apart in the axial direction by the adhesive between the actuators coupled to each other.

Sub-step B4: Decoupling two actuators outside the at least one coupling area, preferably in the edge region, preferably in the coupling plane, particularly preferred by removing piezoceramic material and/or adhesive and/or applying release agents. According to this embodiment, the coupling area, which is reduced in a plane perpendicular to the axis compared to the flat extension of the actuator, can also be worked out after the coupling of the actuators, for example by selective material removal at the piezoceramic layers or by selective material removal at a material connecting two adjacent piezoceramic layers. By applying a release agent in the regions to be decoupled outside the coupling area, the removal of adhesive without leaving any residue can be promoted. It is also conceivable that the decoupled region is subsequently filled with a soft material permitting a passive deformation of the passive regions of the actuators, while the force-coupling of the actuators is still effected via the coupling area.

Sub-step B5: Connecting the electrodes of the actuators with the same polarities with each other by a connecting section, preferably by applying the connecting section onto the electrodes. By this connecting section, the side electrodes of the individual actuators can be particularly easily connected. As a rule, one single contact point is sufficient per actuator. However, a plurality of connecting points or a linear connection across the complete segment height is also conceivable.

The object mentioned in the beginning is also achieved by a piezoelectric stack actuator, preferably produced according to the method according to one of the method claims, comprising at least two actuators which are designed to generate a deflection along an axis when electrically activated, wherein the at least two actuators are stacked along a stacking axis such that the deflections of the actuators generated when the actuators are electrically activated are overlaid along the stacking axis, wherein the at least two actuators are coupled such that a coupling area over which a force-coupling of an actuator to an adjacent actuator is effected is smaller than a projection area of the actuator onto a plane perpendicular to the axis.

It can moreover be of assistance if each one of the actuators comprises at least one of the following features:

The actuator is made up from piezoceramic layers and electric contacts, preferably as a single-layer actuator or as a multi-layer actuator.

The piezoceramic layers are stacked along an axis, preferably such that two adjacent piezoceramic layers face each other with the insertion of one electric contact each, preferably an electrode layer or a contact plate with poles of the same polarities.

The electric contacts are connected with electrodes of corresponding polarities, wherein the electrodes of different polarities are preferably arranged spaced apart at the periphery of the actuator, preferably located on diametrically opposed sides of the actuator.

The piezoceramic layers and the electric contacts are enveloped with a preferably ceramic insulating material, the envelope with the insulating material preferably being air-tight and/or moisture-tight.

However, it can also prove to be useful if the coupling area comprises at least one of the following features:

The at least one coupling area is embodied in an active region of the actuator.

The at least one coupling area is formed at an additional element to be arranged between two actuators to be coupled, the additional element preferably being embodied as an electrode.

The at least one coupling area is formed at one or both axial end(s) of the actuator or the additional element, respectively, preferably such that the coupling area forms one of the or both axial ends of the actuator or the additional element, respectively.

The at least one coupling area is formed forming a chamfer or a step to an adjacent and/or surrounding region, preferably an edge region of the actuator or the additional element, respectively.

The at least one coupling area is embodied such that, with a projection onto a plane perpendicular to the stacking axis, the coupling area is located completely within the projection area of the actuator and is preferably enclosed by the projection area across its complete periphery.

The at least one coupling area is formed in a plane extending perpendicularly to the axis.

The at least one coupling area (K) is formed such that with respect to the projection area (P) of the actuator, the following area ratio applies: $0.7*P \leq K < P$, preferably $0.8*P \leq K \leq 0.99*P$, preferably $0.9*P \leq K \leq 0.95*P$.

The at least one coupling area is formed as an area penetrated by the axis and/or arranged concentrically with respect to the axis, wherein the coupling area is preferably formed circularly or annularly.

The at least one coupling area is formed of an adhesive.

It may also be practical if the stack actuator has at least one of the following features:

At least two actuators are arranged with a regular and/or identical orientation with respect to the stacking axis, preferably such that the electrodes of the actuators with the same polarities are oriented in a line parallel to the stacking axis, and/or that the facing sides of adjacent actuators are parallel.

At least one additional element is arranged between two adjacent actuators.

At least two adjacent actuators are directly actively connected or indirectly actively connected via an additional element, preferably by a firmly bonded connection between the adjacent actuators or between each one of the adjacent actuators and the additional element arranged therebetween, preferably by an adhesive, wherein particularly preferably the adhesives glues the at least one coupling area completely.

At least two adjacent actuators are decoupled from each other, except for the at least one coupling area, preferably in the edge region, preferably in the coupling plane, particularly preferred by removing piezoceramic material and/or adhesive and/or by applying release agents before gluing.

The electrodes of the actuators with the same polarities are connected to each other by a connecting section, wherein the connecting section is preferably applied onto the electrodes.

Advantageous developments result from combinations of the features disclosed in the claims, the description, and the drawings.

Terms and Definitions

The terms "insulating layer" and "insulation" describe the passive region of the actuator. This is the edge region of the piezoceramic layers or piezoceramic material which is not electrically excited by the electrodes and therefore does not deform. In addition to this "insulating layer" and "insulation" of piezoceramic material, the actuator may comprise an envelope of an insulating material.

DESCRIPTION

Figure 1:
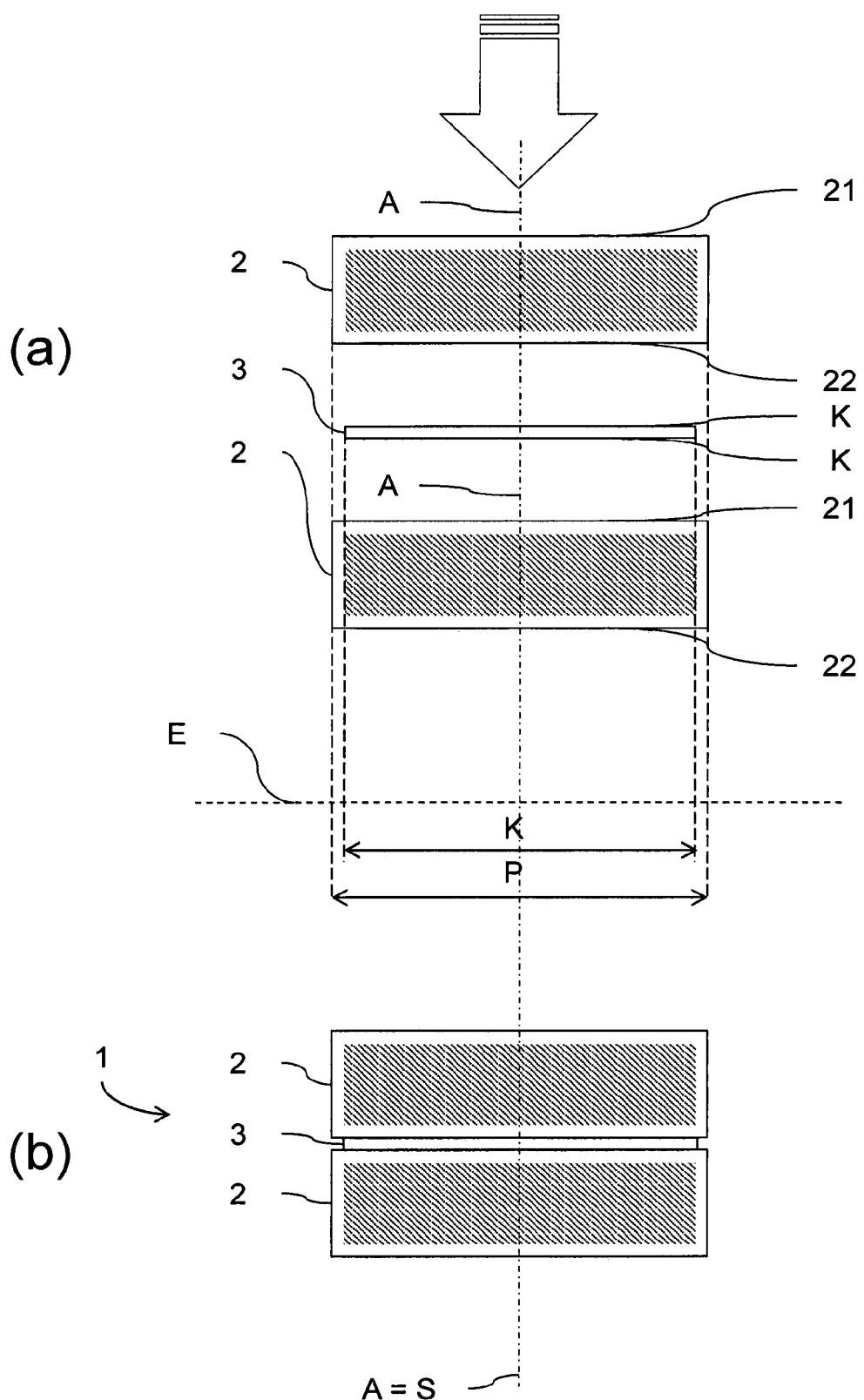
FIG. 1 shows schematic views of the steps of the method according to the invention for producing a piezoelectric stack actuator, wherein view (a) depicts a sectional view of two actuators and an additional element to be introduced between the actuators in a non-connected state, and view (b) depicts a sectional view of the two actuators in a directly connected state with an inserted additional element.

The preferred embodiments of the invention will be described below in detail with reference to the enclosed drawings.

Each actuator 2 of the stack actuator 1 is made up as a single- or multi-layer actuator of piezoceramic 2a and electric contacts or electrode layers (inner electrodes) 2c, 2e. The piezoceramic layers 2a are stacked along the axis A such that two adjacent piezoceramic layers 2a face each other with the insertion of one electric contact (inner electrode) each in the form of an electrode layer or disk 2c, 2e with poles 2b, 2d of the same polarities.

The electric contacts (inner electrodes) 2c, 2e are in turn connected to (outer) electrodes (or side electrodes, respectively) 25, 26 of a corresponding polarity which are arranged spaced apart at the periphery at the actuator 2 on diametrically opposed sides of the actuator 2. The arrangement of the (outer) electrodes (or side electrodes, respectively) 25, 26 in direct proximity with respect to each other, however, may also be advantageous. In the present example, an electrode layer 2c is connected as an inner electrode to the positive pole 2b of the piezoceramic layer 2a and connected to the positive outer electrode 25 (in FIG. 6 in the right), while an electrode layer 2e is connected as an inner electrode to the negative pole 2d of the piezoceramic layer 2a and connected to the negative outer electrode 26.

Figure 2:
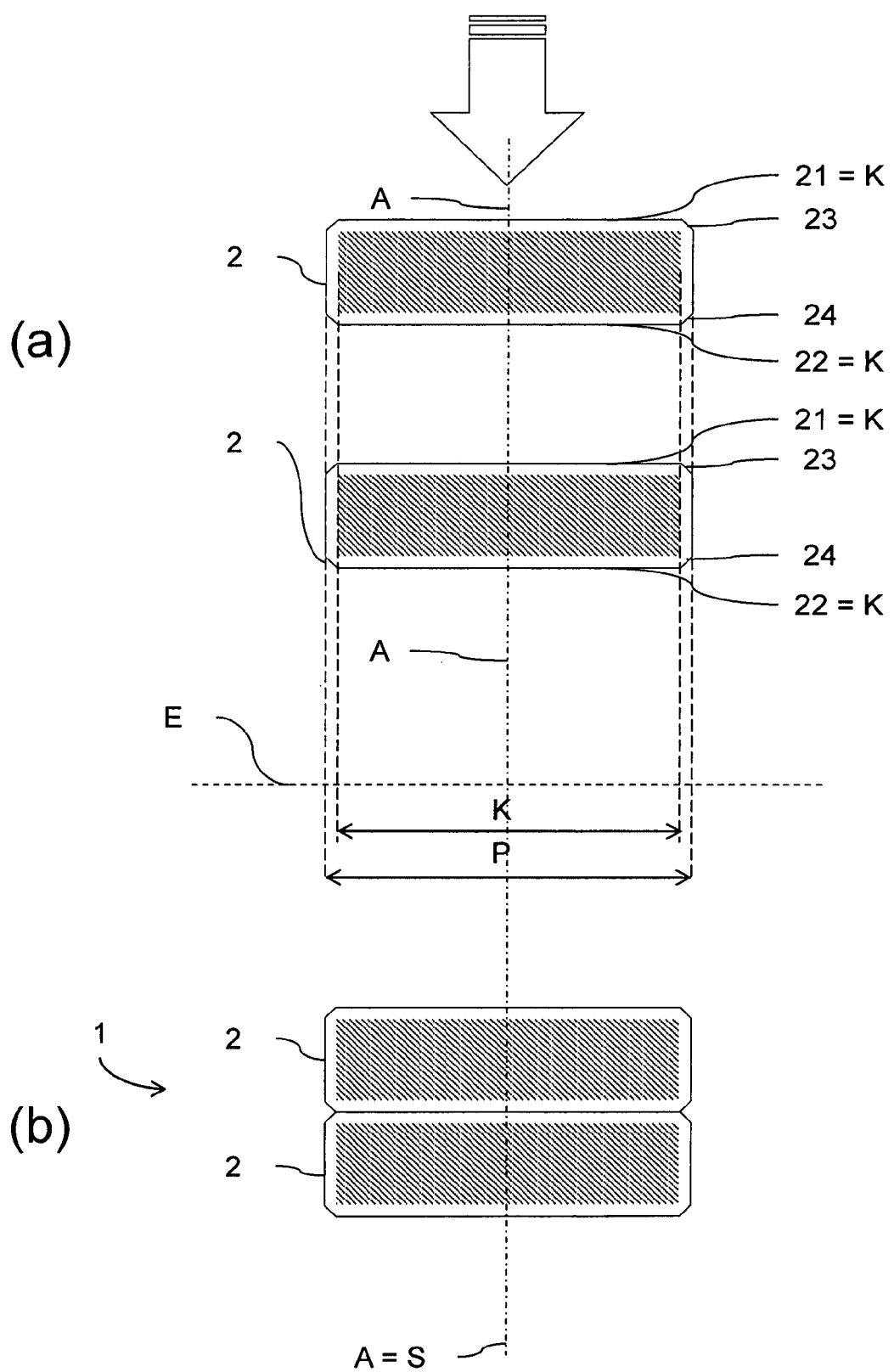
FIG. 2 shows schematic views of the steps of the method according to the invention for producing a piezoelectric stack actuator, wherein in contrast to FIG. 1, the upper sides and bottom sides of the actuators are chamfered and the actuators are directly coupled to each other without the insertion of an additional element.
Figure 3:
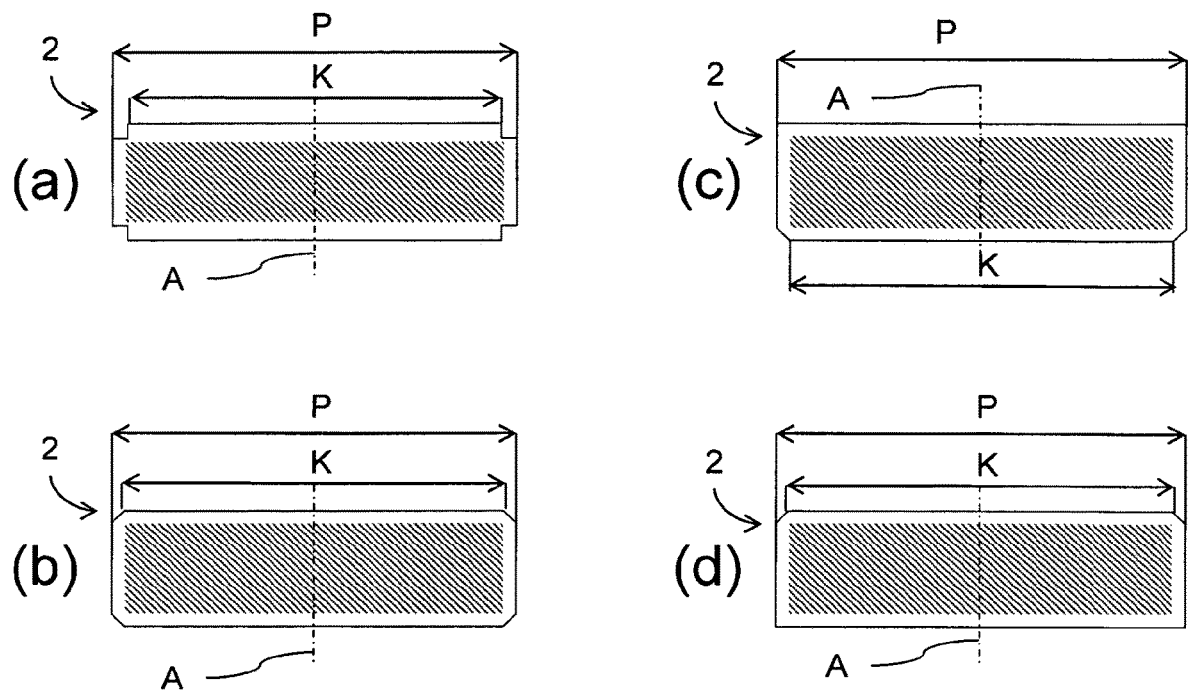
FIG. 3 shows in views (a) to (d) schematic sectional views of further embodiments of actuators whose coupling areas are smaller than the projection area of the actuator onto a plane perpendicular to the axis.

The piezoceramic layers 2a and the electric contacts or electrode layers (inner electrodes) 2c, 2e have different sizes and are stacked one upon the other such that the piezoceramic layers 2a extend radially to the axis A beyond the electric contacts or electrode layers (inner electrodes) 2c, 2e. Thereby, the electric contacts or electrode layers (inner electrodes) 2c, 2e are surrounded at their edges by piezoceramic material to create an air- and moisture-tight "insulation" permitting the use of the actuator 2 in a damp environment. The sections of the piezoceramic layers 2a covered and activatable by the electric contacts or electrode layers (inner electrodes) 2c, 2e, or the sections which, with a projection onto a plane oriented perpendicularly to the axis A, are located radially within the electric contacts or electrode layer (inner electrodes) 2c, 2e, form the active region of the actuator (in FIGS. 1 to 3 shown as a shaded area) which is deformed when electrically activated. The sections of the piezoceramic layers 2a not covered by the electric contacts or electrode layers (inner electrodes) 2c, 2e and therefore not activatable, or the sections which, with a projection onto a plane E oriented perpendicularly to the axis A, are located radially outside the electric contacts or electrode layer (inner electrodes) 2c, 2e, form the passive edge region of the actuator 2 which passively follows the deformation of the active region. At the periphery, on diametrically opposed sides of the envelope, the (outer) electrodes (or side electrodes, respectively) 25, 26 are arranged which slightly project in the radial direction to facilitate electric bonding.

Figure 5:
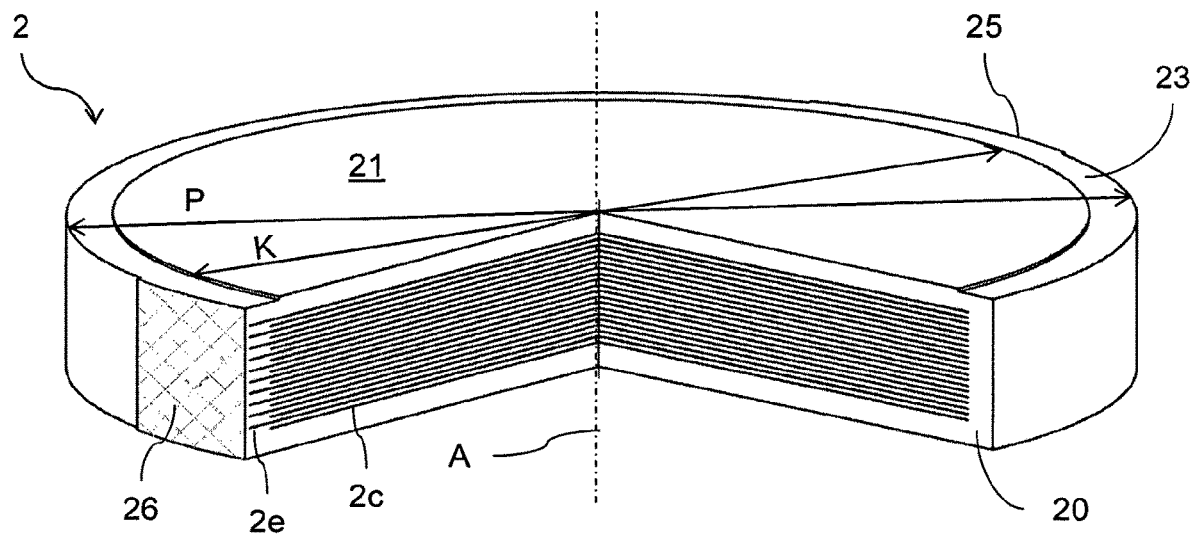
FIG. 5 shows a perspective view of an actuator represented in a partial section which is employed in the method according to the invention for producing a piezoelectric stack actuator.

The actuator 2 represented in FIG. 5 in a partially sectional perspective view comprises altogether 20 piezoceramic layers 2a, where 10 electric contacts (inner electrodes) 2e are connected to the (outer) negative electrode (or side electrode, respectively) 26 (in FIG. 5 in the left in the picture) and 10 electric contacts (inner electrodes) 2c are connected to the (outer) positive electrode 25 (or side electrode, respectively; in FIG. 5 in the right in the picture, representation concealed).

In a preferred embodiment, a monolithically sintered ceramic insulating layer 20 surrounds the actuator 2 at its periphery with the exception of the negative electrode 25 and the positive electrode 26.

In the present example, a circular coupling area K is formed at the upper side 21 of each actuator 2 of a piezoceramic material. The coupling area K extends in a plane E perpendicular to the axis A concentrically to the axis A of the actuator 2 and is arranged axially offset to the top by a step with respect to an adjacent and surrounding edge region of the actuator 2 to form the upper axial end of the actuator 2.

As an alternative or in addition to the upper-side coupling area K, at the bottom side of the actuator 2, a corresponding coupling area K can be formed (cf. FIG. 3a). Instead of a step, the coupling area K can also pass over into the adjacent or surrounding region, in particular edge region, via a chamfer (cf. FIGS. 3b to 3d).

The coupling area K is, according to the invention, smaller than a projection area P of the actuator 2 onto a plane E perpendicular to the axis A. The meaning of this feature will be illustrated with reference to FIGS. 1 to 4.

Each actuator 2 generates a deflection along its axis A when electrically activated. This direction of deflection corresponds to the axis A along which the piezoceramic layers 2a are stacked one upon the other. When electrically activated, the active region of the actuator 2 (represented in a shaded manner in FIGS. 1 to 3) is deformed. The passive region of the actuator 2 (in FIGS. 1 to 3 represented outside the shaded area) does not actively deform but follows the deformation of the active region passively.

Figure 4:
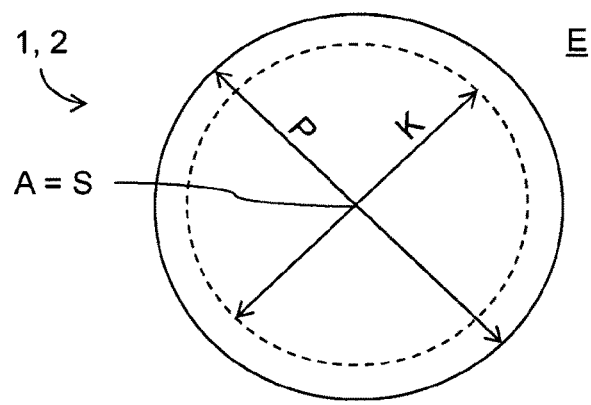
FIG. 4 shows a plan view onto a piezoelectric stack actuator made up of identical actuators, wherein the actuators are stacked along a stacking axis, wherein the coupling area between adjacent actuators is smaller than the projection area of the actuators onto a plane perpendicular to the axis or stacking axis, respectively.

In the present example, with a projection onto a plane E perpendicular to the stacking axis S, the coupling area K is located completely within the projection area P of the actuator 2 and is surrounded by the projection area P across its complete periphery (cf. FIG. 4).

For illustrating the principle of the invention with reference to the figures, among other things, stack actuators 1 which are made up from such actuators 2 will be described below. The number of actuators 2 coupled into a stack actuator 1 is not restricted.

Figure 7:
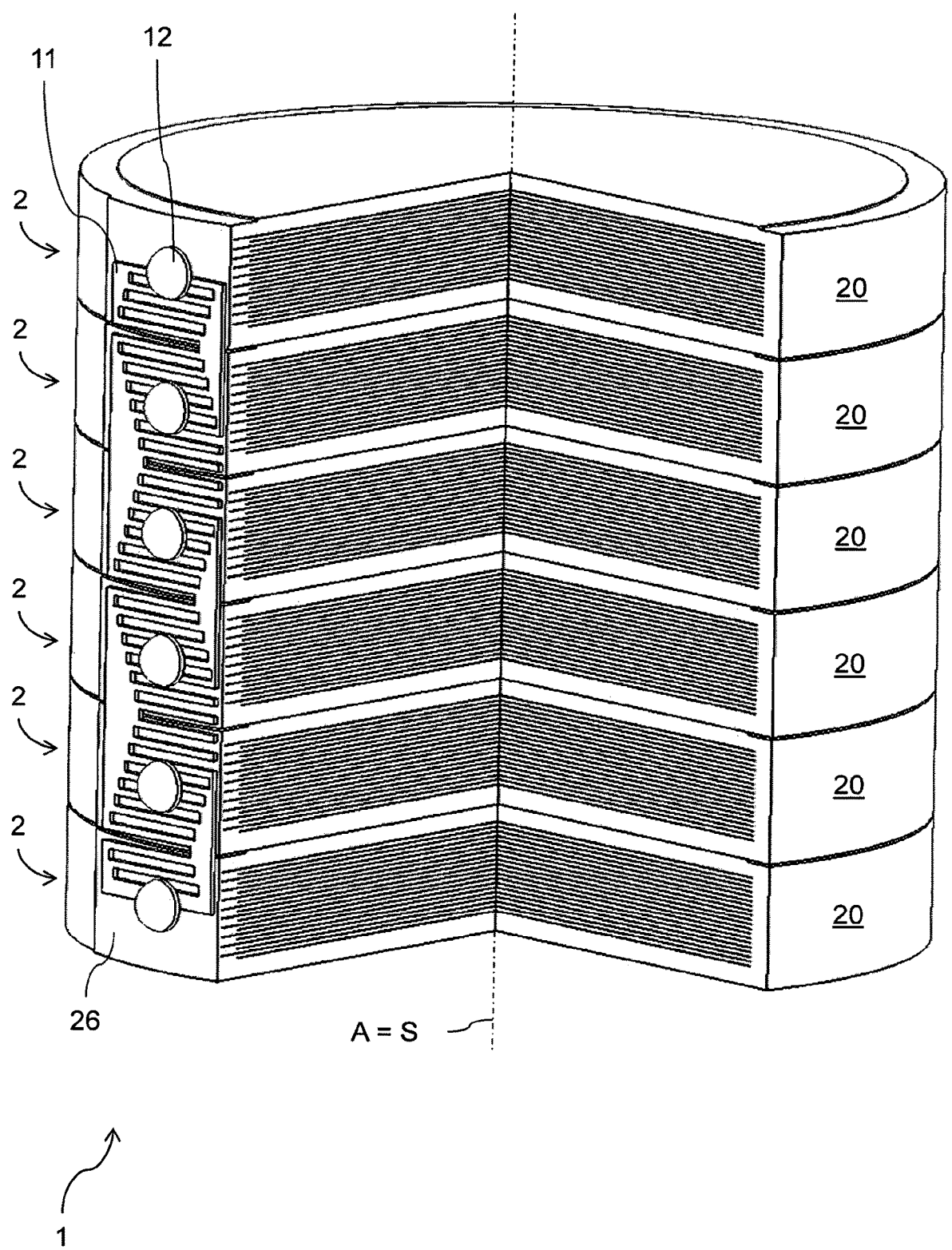
FIG. 7 shows a perspective view of a stack actuator represented in a partial section produced from a plurality of actuators according to FIG. 5.

The piezoelectric stack actuator 1 illustrated in FIG. 7, for example, consists of altogether six individual actuators 2 which are each by themselves functional to generate a deflection along an axis A each when electrically activated.

In the stack actuator 1 represented in FIG. 7, the individual actuators 2 are coupled such that the deflections of the actuators 2 generated when the actuators are electrically activated are overlaid along the stacking axis S and the force-coupling of the actuators 2 each takes place over the upper-side coupling area K that is smaller than a projection area P of the actuator 2 onto a plane E perpendicular to the stacking axis S.

The identically designed actuators 2 (cf. FIG. 5) are arranged with an identical orientation with respect to the stacking axis S such that the coupling area K faces upwards and the (outer/side) electrodes 25, 26 of the actuators 2 with the same polarities are oriented in a line parallel to the stacking axis S. The front sides of adjacent actuators 2 facing each other are parallel.

In the example according to FIG. 7, two adjacent actuators 2 each are directly actively connected by an adhesive forming a firmly bonded connection and are completely glued at one coupling area K each.

The (outer/side) electrodes 25, 26 of the actuators 2 with the same polarities are connected to each other by a connecting section 11, the connecting section 11 being fixed to the corresponding electrode of each actuator 2 at an individual fixing point 12.

In the coupling plane which includes the coupling area K, the edge regions of the actuators 2 are decoupled from each other outside the coupling area K and freely movable with respect to each other. Consequently, peak loads caused by passive deformations of the piezoceramic layers 2a can be reduced without mutually blocking the coupling of the actuators 2 in the edge regions. Thereby, a crack formation is prevented and the service life of the stack actuator 1 is considerably increased.

In the present example, each coupling area K is designed as a plane extending perpendicularly to the axis A or S, respectively. The area dimension of the coupling area K is approximately 0.9-times or 90% of the projection area P of the actuator 2 onto the plane perpendicular to the axis A.

In other words, the advantage of the invention, according to which the coupling area K is reduced compared to the flat extension of the actuator 2 in a plane perpendicular to the axis A, is analogously that the adjacent actuators 2 in the edge regions formed by passive insulation edges are selectively decoupled from each other. In each actuator 2, tensile stresses occur in the so-called passive region in case of expansions since it does not contain any electrodes 2b and therefore does not actively deform. Due to the low height of the actuators 2 and a passive deformation of the edge regions, the tensile stress is below a critical load in each individual actuator 2. When the actuators 2 are glued all-over across their complete cross-sectional areas (extension in a plane perpendicular to the axis A), the coupling of the actuators would block and prevent this deformation. The effect will be increased the more actuators 2 are glued one upon the other. The stresses caused by the deformation would sum up without any countermeasures being taken and exceed the final strength of the passive boundary layer. At the weakest points, a crack formation would result without the features according to the invention.

A stress relief by the adhesive layers is usually not sufficient since for achieving high actuator stiffness, stiff adhesives and very thin glue gaps are employed. It is nevertheless within the scope of the invention that even soft and damping adhesives may be used.

Gluing is therefore preferably only performed at the coupling areas K, and not in the edge regions of the actuators 2 which surround the coupling areas K in the coupling planes. The coupling areas K are smaller than the flat extension of the actuators 2 to be coupled in a plane E perpendicular to the stacking axis S, or smaller than the projection areas P of the actuators 2 to be coupled onto a plane E perpendicular to the axis A or S, respectively (cf. FIG. 4). Since the deformation of the actuators 2 occurs exactly along this axis A or S, respectively, for the deformation of the passive regions of the actuators 2, thus a corresponding possibility of reducing peak loads is created.

To realize the subject matter of the invention, different variants of the embodiment are conceivable.

It is on the one hand possible to leave the adhesive away in the edge region. Technically, this is complicated since the adhesive will flow during curing under pressure and often also at an increased temperature. A defined and reproducible gluing on an unlimited area within a plane is thus hardly possible. Therefore, the coupling area K is preferably arranged offset to the adjacent areas or limited.

Preferably, a release agent is therefore applied in the region of the insulation edge which delimits the coupling area K by preventing either the contact with the adhesive or at least its adhesion to at least one connecting partner.

Figure 6:
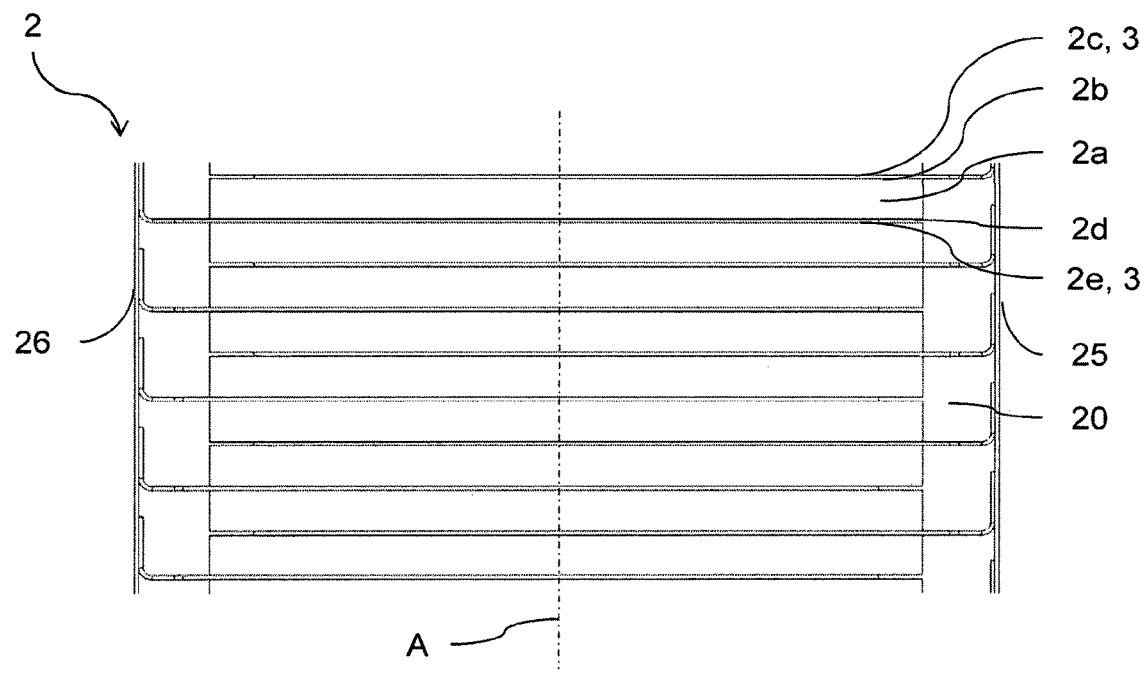
FIG. 6 shows a schematic sectional view of a so-called high-voltage stack with single-layer actuators of piezoceramic and electric contacts (inner electrodes) in the form of contact plates, wherein the piezoceramic layers are stacked onto each other with the insertion of one contact plate each with poles of the same polarities facing each other, wherein the contact plates are connected to outer electrodes or side electrodes, respectively, via which the piezoceramic layers can be simultaneously activated.

As an alternative, a thin additional element 3 with a smaller cross-section can be introduced between two actuators 2 each, wherein the additional element 3 forms the coupling areas K to the adjacent actuators 2 (FIG. 1 or FIG. 6). For example, thin metal lamina with peripherally smaller dimensions than the actuators 2 (at least smaller by an amount equal to the width of the insulation edge) can be glued between the actuators 2. Thus, the installation edge remains free and may deform as with an individual actuator 2.

Working out a small step at the axial front sides of the individual actuators 2 is also possible (FIG. 3a). The step is approximately as wide as the insulation edge and a few 10 µm high. It leads to the same result as the insertion of an additional thin additional element 3 (FIG. 1 or FIG. 6), however facilitates the assembly and positioning and reduces the number of glue joints. The step can be provided both only on one side (not represented) and on both sides (FIG. 3a). With a one-sided design, the production efforts are reduced, with a two-sided design, the removal per side can be reduced, thus reducing the required thickness of the passive end layers.

Instead of the step, a chamfer or any other recess can be also used (FIGS. 3a to 3d). Furthermore, the use of actuators 2 with an arched surface is possible.

With high-voltage actuators, a thin plate with a reduced cross-section is glued between the actuator segments by default (FIG. 6). This simultaneously serves both as the electrode 2b, 2d for later contacting the outer electrodes 25, 26 and the electrodes at the surface of the stack, and also as an additional element 3 by reducing the coupling area between the actuators 2 compared to the surface extension of the actuators 2 in a plane oriented perpendicularly to the axis A, S. However, the actuators 2 are coated with an adhesive for protecting them from external influences, whereby the remaining gaps in the edge region of the actuators 2 are filled with an adhesive.

A solution approach for this type of actuator is the application of a protective layer which does not completely fill the gaps. This is possible on the one hand by applying a very thin layer (e. g. evaporation, spraying, . . . ). Furthermore, the application of a film instead of a liquid is possible.

A further alternative is to fill the gaps with a resilient material. Subsequently, the stack can be enveloped as usual.

For both types of actuators 2, the mentioned solution approaches are applicable for arbitrary cross-sections with respect to the shape (round, oval, rectangular, . . . ) and size.

Here, not only full cross-sections are conceivable, but also hollow cross-sections, for example in the form of hollow cylinders.

Tests with various actuators 2 showed that the service life with a static tension of individual chip actuators is usually essentially higher than that of glued chip stacks, in some cases even by at least the factor 2.

By the decoupling of the critical regions of the chips according to the invention, the advantage with respect to the service life in a glued stack is maintained.

With actuators 2 that have a circular cross-section in a plane perpendicular to the stacking axis S, the ratio of the diameter D to the height H can be specified. In an advantageous development of the above-described embodiments, the ratio is $D/H \geq 1$, preferably $D/H > 5$, and particularly preferred $D/H = 6.4$. It can furthermore make sense for $D/H$ to be $<50$.

With actuators 2 that have a rectangular cross-section in a plane perpendicular to the stacking axis S, the ratio of the edge length L to the height H can be specified. In an advantageous development relating to actuators 2 with a rectangular cross-section, the ratio is $L/H \geq 1$, preferably $L/H > 5$, and particularly preferred $L/H = 6.4$. It can furthermore make sense for $L/H < 50$.

With such D/H and L/H ratios it is possible to provide actuators with a high stiffness and simultaneously a high deflection which also have a minimum tendency to crack and consequently a high reliability.

With actuators 2 with a circular cross-section, there is in general an advantage compared to actuators 2 with a rectangular cross-section in that a more uniform deformation in the transition region between the active and the passive regions takes place since the passive region has a constant radial distance from the stacking axis S, which is not the case in square or rectangular actuator cross-sections.

LIST OF REFERENCE NUMERALS 1 stack actuator
2 actuator
2a piezoceramic layer
2b positive pole
2c contact (plate) or (inner) electrode for positive pole
2d negative pole
2e contact (plate) or (inner) electrode for negative pole
3 additional element
20 insulation
21 upper side
22 bottom side
23 step/chamfer at the upper side
24 step/chamfer at the bottom side
25 (outer/side) electrode positive pole
26 (outer/side) electrode negative pole
A axis
D diameter of an actuator with a circular cross-section
E plane perpendicular to the stacking axis
H height of an actuator
K coupling area
L edge length of an actuator with a rectangular cross-section
P projection area onto the plane perpendicular to the axis
S stacking axis

The invention claimed is:

1. A method for producing a piezoelectric stack actuator, the method comprising:
   a. Step A: providing at least two actuators, each actuator including a top and a bottom surface configured to be connected directly, or indirectly via an additional element, to a respective top or bottom surface of an adjacent actuator, the at least two actuators are configured and designed to generate a deflection along an axis (A) when electrically activated, wherein step A includes sub-steps of:
      Sub-step A1: providing piezoceramic layers and electric contacts to make up the at least two actuators as multi-layer actuators, and
      Sub-step A4: enveloping the piezoceramic layers and the electric contacts with a ceramic insulating material; and
   b. Step B: mechanically coupling the at least two actuators to define a mutual coupling area (K) including ceramic insulating material of the enveloped piezoceramic layers between each two adjacent actuators to form the stack actuator that is centered and stacked along a stacking axis (S) such that deflections of the actuators generated when the actuators are electrically activated will be overlaid along the stacking axis (S) and there is a force-coupling of the actuators over the coupling area (K), wherein the coupling area (K) is smaller than a projection area (P) resulting from a projection of each of the actuators onto a plane (E) perpendicular to the stacking axis (S).

2. Method according to claim 1, wherein step A comprises:
   stacking the piezoceramic layers along the axis (A).

3. The method according to claim 1, wherein step B comprises:
   arranging the additional element between two adjacent actuators.

4. Method according to claim 2, wherein step A comprises:
   stacking the piezoceramic layers along the axis (A), such that two adjacent piezoceramic layers face each other with the insertion of one electric contact each, the contact being an electrode layer or a contact plate, with poles of same polarities.

5. The method according to claim 2, wherein step B comprises:
   arranging an additional element embodied as an electrode between two adjacent actuators.

6. Method according to claim 1, wherein step A comprises connecting the electric contacts with electrodes of corresponding polarities.

7. Method according to claim 1, wherein step A comprises enveloping the piezoceramic layers and the electric contacts with a ceramic insulating sintered to be monolithic.

8. Method according to claim 1, wherein step A comprises forming at least one coupling area (K) for force-coupling the at least two actuators with the adjacent actuator and forming the at least one coupling area (K) at an envelope of each actuator.

9. Method according to claim 1, wherein step A comprises forming at least one coupling area (K) for force-coupling the at least two actuators with the adjacent actuator and forming the at least one coupling area (K) at the additional element to be arranged between the two actuators to be coupled.

10. Method according to claim 1, wherein step A comprises forming at least one coupling area (K) for force-coupling the at least two actuators with the adjacent actuator and forming the at least one coupling area (K) at one or both axial end(s) of the actuator or the additional element, respectively.

11. Method according to claim 1, wherein step A comprises forming at least one coupling area (K) for force-coupling the at least two actuators with the adjacent actuator and forming the at least one coupling area (K) such that with respect to the projection area (P) of the actuator, the following area ratio applies: $0.7*P \leq K < P$.

12. Method according to claim 1, wherein step B comprises connecting the at least two actuators such that two adjacent actuators each are directly actively connected or indirectly actively connected via the additional element.

13. Method according to claim 1, wherein step B comprises decoupling the at least two actuators outside the at least one coupling area (K).

* * * * *